United States Patent [19]

Plies et al.

[11] Patent Number: 5,030,829
[45] Date of Patent: Jul. 9, 1991

[54] METHOD AND APPARATUS FOR INVESTIGATING LATCH-UP PROPAGATION IN COMPLEMENTARY-METAL-OXIDE-SEMICONDUCTOR (CMOS) CIRCUITS

[75] Inventors: Erich Plies; Joerg Quincke, both of Munich, Fed. Rep. of Germany

[73] Assignee: Siemens Aktiengesellschaft, Munich, Fed. Rep. of Germany

[21] Appl. No.: 346,921

[22] Filed: May 3, 1989

[30] Foreign Application Priority Data

Jun. 8, 1988 [DE] Fed. Rep. of Germany ....... 3819489

[51] Int. Cl.$^5$ .......................... G01J 5/02; G01N 21/64; G01R 31/28
[52] U.S. Cl. ................................ 250/358.1; 250/330; 250/338.1; 250/341; 250/458.1
[58] Field of Search ....................... 250/330, 334, 338.1, 250/341, 347, 358.1, 458.1

[56] References Cited

U.S. PATENT DOCUMENTS 4,680,635 7/1987 Khurana ............................ 358/211
4,755,874 6/1988 Esrig et al. ......................... 358/106

FOREIGN PATENT DOCUMENTS 61-263235 11/1986 Japan .

OTHER PUBLICATIONS

Zanoni, E. et al., "Observation of Latch-up Time Evolution in CMOS IC's by Means of SEM Stroboscopic Voltage Contrast Techniques", *IEEE Journal of Solid State Circuits* SC-22, No. 1, Feb. (1987), pp. 65–70.
Quincke, J. et al., "Investigation of Surface-Induced Latch-Up in VLSI CMOS Using The Laser Probe", *Microelectric Engineering*, 7 (1987) Nos. 2–4, pp. 371–375.
Otto et al. "Schaltungsanzlyses in ICs mit dem Rasterlaser-mikroscop", VDI Berichte, No. 659, 1987, pp. 381–394.
Müller R., "Scanning Laser Microscope for Inspection of Micro-Electronic Devices", Siemens Forsch-u. Entwickl.-Ber., vol. 13, No. 1, 1984, pp. 9–14.
Khuranan., "Pulsed Infra-Red Microscopy for Debugging Latch-Up on CMOS Products," IEEE/IRPS 1984, pp. 122–127.
Wilke V., "Optical Scanning Microscopy-The Laser Scan Microscope," Scanning, vol. 7, 1985, pp. 88–96.

*Primary Examiner*—Constantine Hannaher
*Assistant Examiner*—Jacob M. Eisenberg
*Attorney, Agent, or Firm*—Hill, Van Santen, Steadman & Simpson

[57] ABSTRACT

Latch-up propagation is periodically triggered and the intensity of infrared radiation emanating from a CMOS circuit is successively detected at a plurality of measuring points covering the circuit in a grid-like manner at prescribed points in time after the appearance of the trigger signal which triggers latch-up and a measured value representing the intensity of infrared radiation is recorded in a location-dependent manner. The measured values are monitored with a display and the intensity thereof is utilized as the brightness control for the picture elements. Also, the measured values are stored in an image store.

16 Claims, 3 Drawing Sheets

METHOD AND APPARATUS FOR INVESTIGATING LATCH-UP PROPAGATION IN COMPLEMENTARY-METAL-OXIDE-SEMICONDUCTOR (CMOS) CIRCUITS

CROSS REFERENCE TO RELATED APPLICATION

This application relates to an application Ser. No. 346,920 filed May 3, 1989.

BACKGROUND OF THE INVENTION

1. Field of the Invention:

The present invention relates to a method and to an apparatus for investigating the latch-up propagation in CMOS circuits by documenting the infrared radiation emitted by the circuit in response to latch-up conditions.

2. Description of the Prior Art

Parasitic thyristor structures always exist in integrated CMOS circuits and triggering thereof can lead to a destruction of the component as a consequence of the heating of the current paths that thereby occurs. Fundamentally, this effect referred to as latch-up can be recognized on the basis of the discontinuous rise and the locking of the supply current without, however, being able to identify the affected circuit parts and improve them by modifying the design or with technological measures (higher well and substrate dopings, utilization of a low-impedance epitaxial layer, etc.). A series of method for localizing latch-up-sensitive regions in integrated CMOS circuits have therefore been developed (see, for example, Otto, et al, "Schaltungsanalyse in ICs mit dem Rasterlasermikroskop", VDI Berichte, No. 659,1987, pp. 381–393; R. Muller, "Scanning Laser Microscope for Inspection of Microelectronic Devices", Siemens Forschungs-und Entwicklungsberichte, Vol. 13, No. 1, 1984, pp. 9–14; and N. Khurana, "Pulsed Infra-Red Microscopy for Debugging Latch-Up on CMOS Products", IEEE/IRPS, International Reliability Physics Symposium 1984, pp. 122–127). The method disclosed by Khurana in the IEEE/IRPS article thereby particularly offers the advantage that the primary latch-up centers that cannot be localized with conventional liquid crystal techniques can also be identified.

SUMMARY OF THE INVENTION

The object of the present invention is to provide a method and an arrangement with which the latch-up propagation in CMOS circuits can be investigated with high spatial and chronological resolution.

According to the method of the invention, the above object is achieved by periodically triggering latch-up conditions, identifying the intensity of infrared radiation successively at a plurality of measuring points at prescribed points in time after the triggering of latch-up, and recording respective measured values representing the measured intensities at the measuring points.

Apparatus for implementing the method is particularly characterized by a lens system for focusing the infrared radiation emanating from the measuring points, a deflection unit driven by a scan generator whereby the output signals of the scan generator determine the location of the respective measuring points within the circuit, circuit means for generating trigger signals that trigger latch-up conditions, a detector for documenting the infrared radiation, circuit means for generating a time window, electronic circuits for generating measured values that represent the intensities of the infrared radiation, and a unit for storing the measured values.

The advantage that may be obtained in practicing the present invention is particularly that the latch-up propagation in CMOS circuits can be investigated with high spatial and chronological resolution.

According to a particular feature of the invention, an image of the circuit is generated and the intensity of the infrared radiation determines the brightness of the picture elements respectively assigned to the measuring points.

According to another feature of the invention, latch-up is triggered by a particle beam directed onto the circuit.

According to another feature of the invention, the latch-up is triggered by an electrical trigger signal.

According to another feature of the invention, a delay trigger signal defines a time window for measuring the intensity of the infrared radiation.

According to another feature of the invention, the measuring points are selected to cover the circuit in a grid-like manner.

According to another feature of the invention, a pulse generator is provided for generating the trigger signal and is driven by a square-wave generator.

According to another feature of the invention, the circuit for generating a time window comprises a monoflop that has its input charged with the output signal of a pulse generator, a delay element and an optical modulator driven by the delay element and arranged in the beam path preceding the detector.

According to another feature of the invention, the circuit generating the time window comprises a monoflop that has its input charged with the output signal of a pulse generator, a delay element and a gate circuit driven by the delay element and charged with a signal that represents the measured intensity.

According to another feature of the invention, a low-pass filter and a lock-in amplifier precede the unit for storing measured values, a reference input of the lock-in amplifier being charged with the output signal of a square-wave generator.

BRIEF DESCRIPTION OF THE DRAWING

Other objects, features and advantages of the invention, its organization, construction and operation will be best understood from the following detailed description, taken in conjunction with the accompanying drawings, on which.

DESCRIPTION OF THE PREFERRED EMBODIMENTS

In the method disclosed by Khurana in the IEEE-/IRPS article, the latch-up propagation in CMOS modules is investigated by documentation of the infrared radiation emitted by the circuit. Of particular significance is the thermal radiation having an intensity maximum at $\lambda = 8-10$ μm arising due to the electrical heating of the thyristor structures and the infrared radiation having an intensity maximum $\lambda = 1.1$ μm generated due to the recombination of excessive electron-hole pairs, this primarily appearing in the region of the pn junctions polarized in the conducting direction. In order to be able to investigate latch-up propagation in CMOS circuits with high spatial and chronological resolution in a modified scanning laser microscope, the following are proposed:

periodically triggering a parasitic thyristor structure of the circuit controlled by a trigger signal; sensing the intensity of the recombination radiation and/or thermal radiation (referred to below in brief as infrared radiation) successively at a plurality of measuring points preferably covering the circuit in a grid-like manner at a prescribed point in time after the appearance of the trigger signal which triggers the latch-up;

registering a measured value at the measuring points that respectively represents the intensity $I(\tau)$ measured at the point in time $\tau$;

and, as warranted, generating an image of the circuit whereby the intensity $I(\tau)$ of the infrared radiation defines the brightness of the picture elements respectively assigned to the measuring points.

Figure 1:
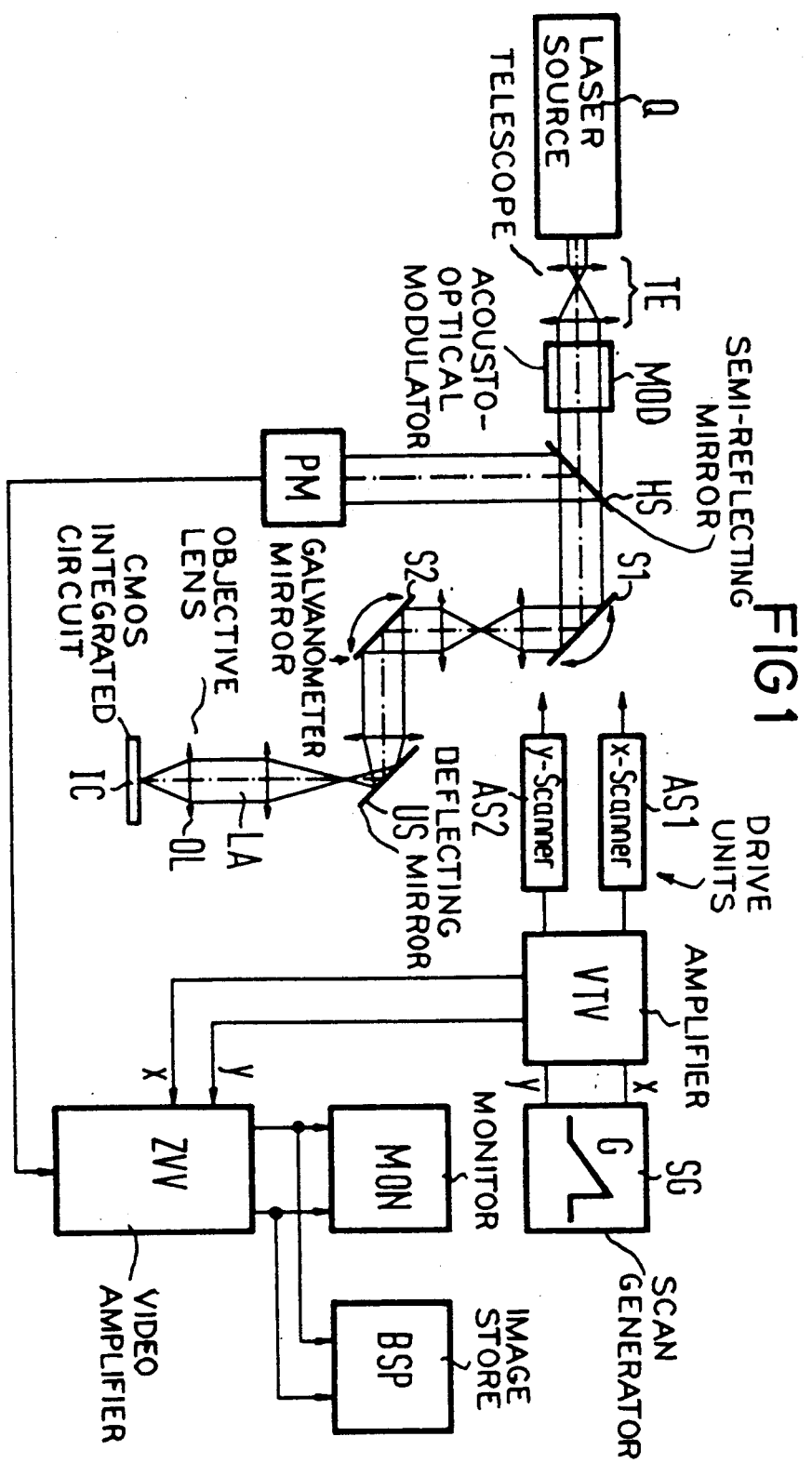
FIG. 1 is a schematic representation of the structure of a scanning laser microscope.

For example, the scanning laser microscope disclosed by V. Wilke, "Optical Scanning Microscopy-The Laser Scan Microscope", Scanning, Vol. 7, 1985, pp. 88–96, whose schematic structure is illustrated in FIG. 1, can be employed for the implementation of the method of the present invention. This comprises a laser source Q (helium-neon laser), a telescope TE for expanding the laser beam LA, and acousto-optical modulator MOD, a semi-reflective mirror HS, a deflection unit composed of two highly-accurate galvanometer mirrors S1 and S2, a deflecting mirror US and an objective lens OL for focusing the laser beam LA on the specimen IC, preferably an integrated CMOS circuit. The scanning laser microscope is also equipped with a telescentric optics (not referenced in detail in FIG. 1) that assures that the laser beam LA topically resides in the pupil of the objective lens and therefore executes only an angular motion with the pupil as the pivot point. Independently of the position of the galvanometer mirrors S1 and S2, rotatable around orthoganal axes, therefore, the full aperture of the objective lens OL is always utilized, whereby the size of the beam spot on the specimen IC is independent of the location of the focus in the plane of the specimen surface.

The deflection voltages that define the position of the laser beam LA on the specimen IC are generated in a highly-accurate scan generator SG and are amplified in a tandem amplifier VTV whose output signals are applied at the inputs of the drive units AS1 and AS2 assigned to the mirrors S1 and S2. In order to generate a reflected light image of the specimen IC, the radiation backscattered into the objective lens OL and coupled out the assistance of the semi-reflecting mirror HS is documented with a photomultiplier PM whose amplified output signal increases the intensity of the write beam of a monitor MON. The monitor MON is preferably preceded by a video amplifier ZVV at whose inputs both the output signal of the photomultiplier PM and the output signals of the tandem amplifier VTV representing the location of the laser beam LA on the specimen IC are applied. The measured data (coordinates of the measuring point of the specimen IC, intensity of the back-scattered radiation, etc.) are usually deposited in an image store BSP assigned to the monitor MON in order to be able to portray and evaluate the same after the measurement.

Figure 2:
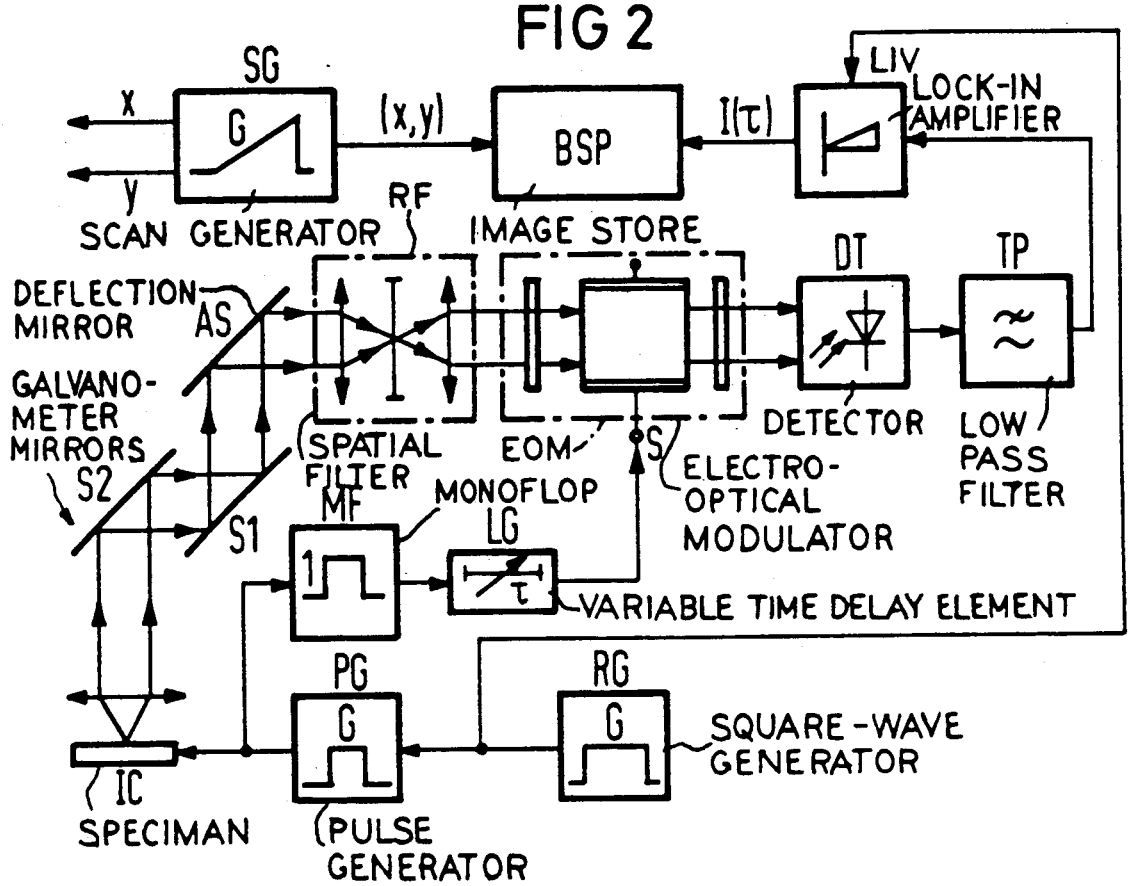
FIG. 2 is a schematic representation of an exemplary embodiment of an arrangement for utilizing the scanning laser microscope for implementing the method of the present invention.

For implementing the method of the invention, the scanning laser microscope is additionally equipped with another deflection mirror AS that can be brought into the beam path (see FIG. 2 in which only the components of the scanning laser microscope critical for the implementation of the method are shown) the infrared radiation IR emanating from the respective measuring point being coupled out with this additional deflection mirror AS and being supplied to a detector DT. The position of the measuring point on the specimen surface is thereby prescribed with the assistance of the deflection voltage of the scan generator SG that defines the position of the mirrors S1 or, respectively, S2. Therefore, the measuring points lie distributed over the specimen surface in a grid-like manner when the drive units AS1 and AS2 of the mirrors S1 or, respectively, S2 are charged with sawtooth signals shown in line h and i of FIG. 3.

The out-coupled infrared radiation IR traverses a spatial filter RF (suppression of the noise and background radiation) composed of two lenses and an aperture diaphragm (aperture diameter of a few μm) and traverses an electro-optical modulator EOM, for example a Pockel's cell, arranged between two polarizers in order to be subsequently documented with a nitrogen-cooled germanium PIN diode. The detector DT is followed by a low-pass filter TP whose output signal is applied at the input of the lock-in amplifier LIV. The lock-in amplifier LIV has its output connected to a data input of the image store BSP whose second input receives the coordinates of the respective measuring point from the scan generator SG.

The latch-up is periodically triggered and suppressed in the specimen IC under investigation by the pulsed supply voltage. The electronics for driving the specimen IC is therefore composed of a pulse generator PG (pulse repetition rate $f_{PG} = 100$ kHz–1 MHz) that generates the latch-up trigger signals and of a square-wave generator RG (pulse repetition rate $f_{RG} < < f_{PG}$ whose output signal is applied to the control input of th pulse generator PG and as the reference input of the lock-in amplifier LIV. The pulse repetition rate $f_{RG}$ of the square-wave generator RG is thereby selected such that it exceeds a frequency $f_{AD}$ (sampling rate) of the output signal of the scan generator SG that defines the line deflection by at least 1–2 orders of magnitude ($f_{AT} \approx 100$ kHz–1 kHz, $f_{RG} \approx 10$ kHz).

Since the intensity I(t) of the infrared radiation IR is sensed at the respective measuring point only at a predetermined point in time $\tau$ following the triggering of the parasitic thyristor circuit, the measuring electronics of the scanning laser microscope is equipped with a circuit MF/LG that defines a time window, the output signal of this circuit MF/LG being applied to the control input S of the electro-optical modulator EOM. This circuit comprises an edge-controlled monoflop MF and a variable delay element LG, whereby the delay element LG defines the position of the time window with respect to the output signal of the pulse generator (latch-up trigger signal) at the input of the signal and the time constant of the monoflop MF determines the width of the time window.

Figure 3:
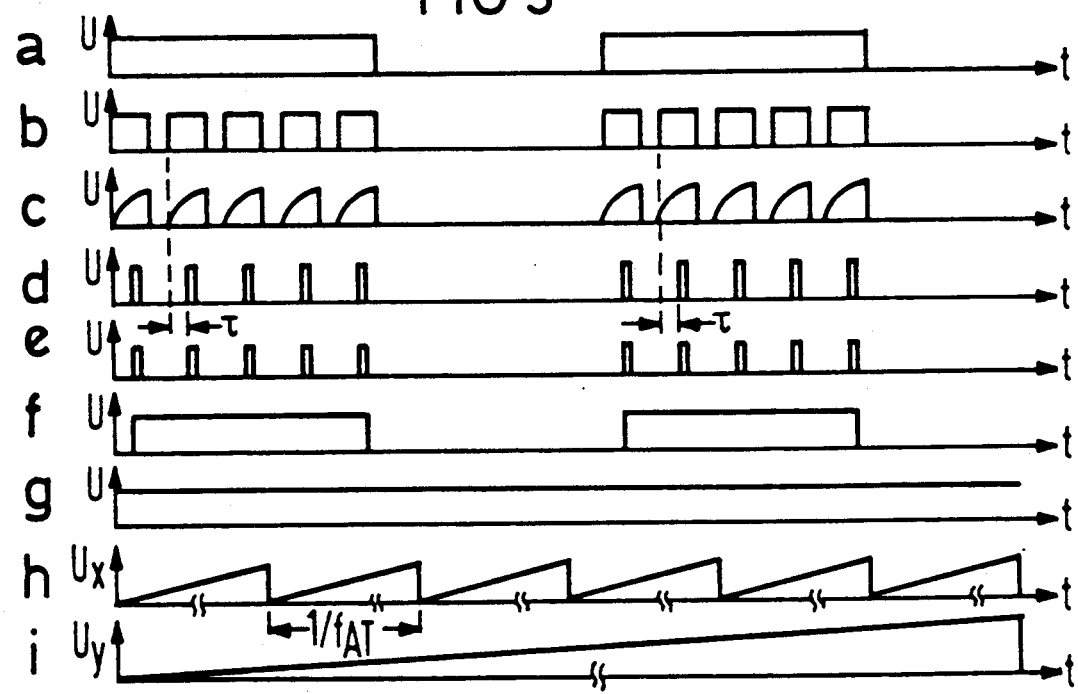
FIG. 3 is a time-dependent graphic illustration of signals occurring within the arrangement of the invention.

The time-dependency of certain signals appearing within the described measuring arrangement are schematically illustrated in FIG. 3. Thereby shown are shown:

line a, the output signal of the square-wave generator RG (frequency $f_{RG}$);

line b, the output signal of the pulse generator PG (frequency $f_{PG}$);

line c, the intensity I(t) of the infrared radiation IR;

line d, the output signal of the delay element LG;

line e, the detector output signal;

line f, the output signal of the low-pass filter TP ($f_{RG} < f_G << f_{PG}$, $f_G$=limit frequency of the low-pass filter TP);

line g, the output signal of the lock-in amplifier LIV having the bandwidth $\Delta f = \pm f_{AT}$ that represents the intensity I(t) of the infrared radiation IR;

line h, the output signal of the drive unit AS1 (x-deflection, scan-frequency $f_{AT}$); and line i, the output signal of the drive unit AS2 (y-deflection).

Figure 4:
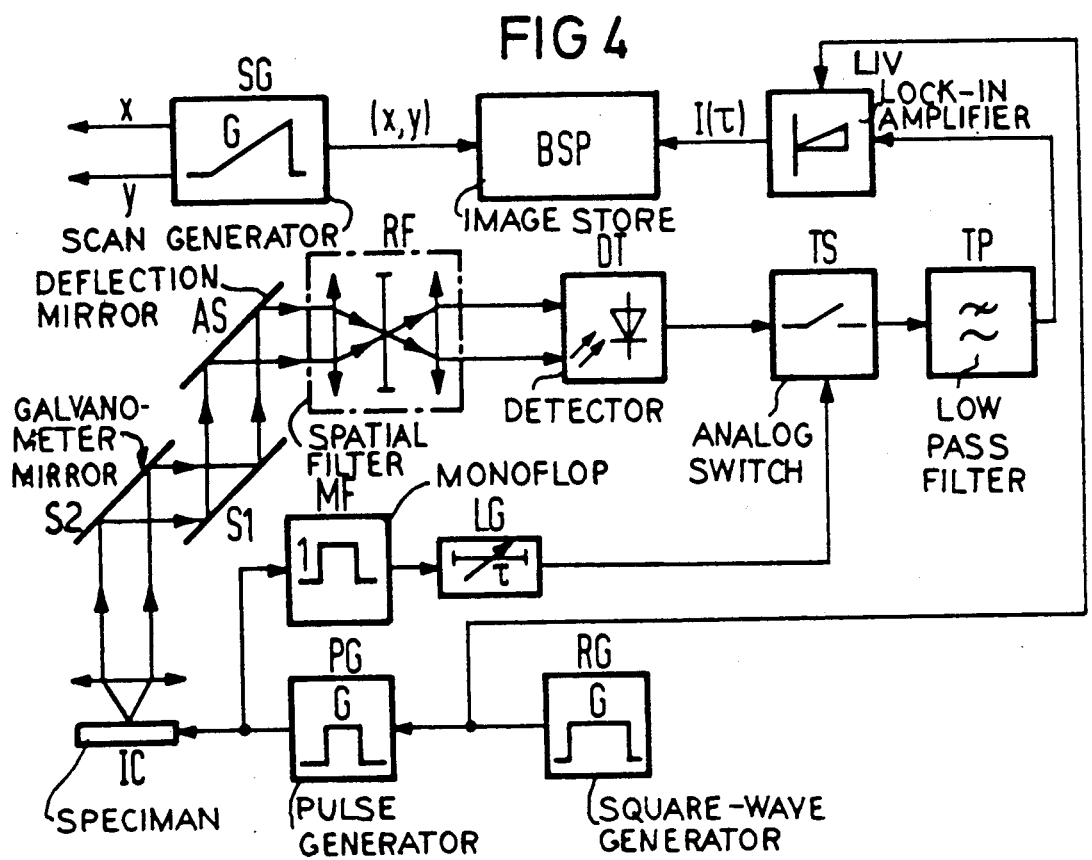
FIG. 4 is a schematic representation of a second exemplary embodiment of an arrangement for implementing the method of the invention.

A second exemplary embodiment of the invention is schematically illustrated in FIG. 4. This differs from the arrangement of FIG. 2 on the basis of an analog switch TS arranged in the signal path between the detector DT and the low-pass filter TP, the analog switch TS replacing the electro-optical modulator EOM. The circuit that defines the time window is again composed of a monoflop MF and a delay element LG whose output signal is applied to the control input of the analog switch TS. The rest of the structure of the measuring electronics remains the same.

After the conclusion of the measurement, an image of the specimen IC can be generated on the monitor MON of the scanning laser microscope, whereby the measured value representing the intensity I ($\tau$) defines the brightness of the picture elements respectively assigned to the measuring points. The monitor image then shows the status of the latch-up progression at the point in time $\tau$.

The invention, of course, is not limited to the described exemplary embodiments. Therefore, it is possible to trigger a parasitic thyristor structure with a laser beam or electron beam directed onto a latch-up-sensitive region of the IC.

The monoflop MF that defines the width of the time window and the delay element LG can be omitted when a two-channel pulse generator PG is used for driving the specimen IC, for example a circuit identified as the model SPG of the Wavetek Company.

Of course, it is also possible to divide the out-coupled infrared radiation into two sub-beams representing the recombination radiation ($\lambda = 1.1$ μm) and the thermal radiation ($\lambda = 8$-10 μm) with the assistance of a wavelength-dependent beam splitter filter and to respectively measure the intensity of the subbeams in a detector which is sensitive for the appertaining radiation.

Although we have described our invention by reference to particular illustrative embodiments, many other changes and modifications may become apparent to those skilled in the art without departing from the spirit and scope of the invention. We therefore intend to include within the patent warranted hereon all such changes and modifications as may reasonably and properly be included within the scope of our contribution to the art.

We claim:

1. A method for investigating latch-up propagation in a complementary-metal-oxide-semiconductor (CMOS) circuit by documenting infrared radiation emitted by the CMOS circuit, comprising the steps of:
   (a) defining measuring locations on the CMOS circuit with a plurality of electrical signals;
   (b) driving a deflection unit with electrical signals which define a measuring location on the CMOS circuit;
   (c) triggering a latch-up condition at the measuring location causing the emission of infrared radiation therefrom;
   (d) focusing the infrared radiation onto the deflection unit;
   (e) detecting the focused infrared radiation with a detector via the deflection unit;
   (f) measuring the intensity of the detected infrared radiation at a predetermined time after the triggering of the latch-up condition at the measuring location;
   (g) registering the location of the measuring location and the measured intensity of the infrared radiation emitted therefrom; and
   (h) repeating the steps (b) through (g) for each of the measuring locations.

2. The method of claim 1, wherein the step (g) of registering is further defined as:
   (g1) imaging the measuring locations on a display device having a plurality of picture elements including controlling the brightness of the picture elements in accordance with the measured intensity.

3. The method of claim 1, wherein the step (c) of triggering is further defined as:
   (c1) directing an electron beam onto the CMOS circuit.

4. The method of claim 1, wherein the step (c) of triggering is further defined as:
   (c1) directing a photon beam onto the CMOS circuit.

5. The method of claim 1, wherein the step (c) of triggering is further defined as:
   (c1) applying an electrical signal to the CMOS circuit.

6. The method of claim 1, wherein the step (f) of measuring for each repetition of the step (h) is further defined as:
   (f1) measuring after a predetermined interval which is the same for each repetition.

7. The method of claim 1, wherein the step (a) if further defined as:
   (a1) defining the measuring locations in a grid pattern by the electrical signals.

8. Apparatus for investigating latch-up propagation in a complementary-metal-oxide-semiconductor circuit, comprising:
   generator means operable to cyclically generate drive signals which define measuring locations on the CMOS circuit;
   a deflection unit connected to said generator means and driven by the drive signals to be directed towards the individual, defined measuring locations;
   trigger means in communication with the CMOS circuit and operable to apply a trigger signal to the CMOS circuit and cause latch-up conditions at the respective measuring locations and the emission of infrared radiation therefrom;

detector means in communication with said deflection unit for sensing the infrared radiation and producing a corresponding electrical signal;

a lens system located between the CMOS circuit and said detector for focusing the infrared radiation onto said deflection unit for guidance to said detector means;

delay means connected to said trigger means and to said detector means and operable to generate a measuring control signal delayed a predetermined interval after said trigger signal for controlling said detector means to produce said corresponding electrical signal;

measuring means connected to said detector means and responsive to said electrical signal to generate a measured value signal corresponding to the intensity of the infrared radiation; and registering means connected to said generator means and to said measuring means for registering the respective measuring locations and their corresponding measured intensities.

9. The apparatus of claim 8, wherein said detector means comprises:

an electronic switch connected to said delay means for receiving said measuring control signal and responsive thereto switch through said electrical signal.

10. The apparatus of claim 9, wherein:

said electronic switch is a gate circuit including an output connected to said measuring means.

11. The apparatus of claim 8, wherein said detector means comprises:

an electro-optical modulator connected to said delay means for receiving said measuring control signal.

12. The apparatus of claim 11, wherein said detector means comprises:

a spatial filter interposed between said deflection means and said electro-optical modulator.

13. The apparatus of claim 8, wherein:

said trigger means comprises a first pulse generator for generating said trigger signal and a second pulse generator connected to and driving said first pulse generator, said second pulse generator having a pulse frequency that is lower than that of said trigger signal.

14. The apparatus of claim 13, wherein said measuring means comprises:

a low-pass filter connected to said detection means and a lock-in amplifier connected between said low-pass filter and said registering means, said lock-in amplifier including a reference input and connected to said second pulse generator.

15. The apparatus of claim 8, wherein said delay means comprises:

a monostable trigger circuit connected to said trigger means and a delay element connected between said monostable trigger circuit and said detector means.

16. The apparatus of claim 13, wherein:

said generator means produces the drive signals at a first predetermined frequency; and said second pulse generator of said trigger means produces pulses at a frequency that is lower than the frequency of the pulses produced by said second pulse generator.

* * * * *